United States Patent
Tei et al.

(10) Patent No.: US 7,658,314 B2
(45) Date of Patent: Feb. 9, 2010

(54) TAIL WIRE CUTTING METHOD AND BONDING APPARATUS

(75) Inventors: Shinsuke Tei, Tachikawa (JP); Noriko Mori, Nishitokyo (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 345 days.

(21) Appl. No.: 11/788,966

(22) Filed: Apr. 23, 2007

(65) Prior Publication Data

US 2007/0246513 A1 Oct. 25, 2007

(30) Foreign Application Priority Data

Apr. 24, 2006 (JP) ............................. 2006-119222

(51) Int. Cl.
*B23K 31/00* (2006.01)

(52) U.S. Cl. .................................... 228/180.5; 228/904

(58) Field of Classification Search ............. 228/180.5, 228/4.5, 904; 257/E21.512, E21.518, E25.013, 257/E23.024, 784; 438/617
See application file for complete search history.

(56) References Cited

U.S. PATENT DOCUMENTS

| | | | | |
|---|---|---|---|---|
| 4,925,083 A | * | 5/1990 | Farassat et al. | 228/102 |
| 5,723,364 A | * | 3/1998 | Nakamura et al. | 438/617 |
| 5,897,049 A | * | 4/1999 | Nakamura et al. | 228/180.5 |
| 5,981,371 A | * | 11/1999 | Yamazaki et al. | 438/617 |
| 6,102,275 A | * | 8/2000 | Hill et al. | 228/180.5 |
| 6,173,885 B1 | * | 1/2001 | Takahashi et al. | 228/180.5 |
| 6,581,283 B2 | * | 6/2003 | Sugiura et al. | 29/843 |
| 6,595,400 B2 | * | 7/2003 | Terakado et al. | 228/4.5 |
| 7,262,124 B2 | * | 8/2007 | Fujisawa | 438/617 |
| 7,456,091 B2 | * | 11/2008 | Kuraya et al. | 438/617 |
| 2001/0022315 A1 | * | 9/2001 | Tsai et al. | 228/180.5 |
| 2003/0162378 A1 | * | 8/2003 | Mikami | 438/612 |
| 2006/0175383 A1 | * | 8/2006 | Mii et al. | 228/180.5 |
| 2006/0216863 A1 | * | 9/2006 | Arakawa | 438/118 |

FOREIGN PATENT DOCUMENTS

| | | | |
|---|---|---|---|
| JP | 58169916 A | * | 10/1983 |
| JP | 2723277 | | 11/1997 |
| JP | 2969953 | | 8/1999 |

* cited by examiner

*Primary Examiner*—Jessica L. Ward
*Assistant Examiner*—Carlos Gamino
(74) *Attorney, Agent, or Firm*—William L. Androlia; H. Henry Koda

(57) ABSTRACT

A tail wire cutting method and bonding apparatus executing the same, in which a capillary raised to a predetermined height and a clamper disposed above the capillary and gripping a wire are caused to make reciprocating oscillation movement on, for instance, a circular arc that has an apex at the above-described predetermined height, thus forming (minute) cracks in a portion between the tail wire and a bonding end of a bonding point, and then cutting of a tail wire sticking out of the tip end of the capillary is executed by way of raising the capillary and clamper.

11 Claims, 13 Drawing Sheets

TAIL WIRE CUTTING METHOD AND BONDING APPARATUS

BACKGROUND OF THE INVENTION

The present invention relates to a tail wire cutting method and a bonding apparatus executing the method.

Assembly processes for ICs (integrated circuits) and other semiconductor devices include a wire bonding process for connecting semiconductor chips and lead frames with wires; and for this wire bonding step, wire bonding apparatuses and bump bonding apparatuses are used typically. In the wire bonding process, connections are made, as shown in FIG. 10, with connecting wires 12a between pads 3 on a semiconductor chip 2 and leads 4 of a lead frame 15, all of that being part of a work 14.

FIG. 11 shows bonding actions in each one of the steps in the above-described bonding process conventionally employed. In the following description, a bonding process taken in a wire bonding apparatus will be described.

(1) In step (a), a ball 5 is formed at the tip end of a wire 12, and a capillary 16 is moved above a pad 3 (first bonding point).

(2) In step (b), the capillary 16 is made to descend, and bonding is performed on the pad 3 (first bonding point). The ball 5 is pressure-bonded onto the pad 3 (first bonding point) to form a first bonding point 6 (pressure-bonded ball).

(3) In step (c), after bonding, the capillary 16 ascends away from the pad 3 (first bonding point) while leading out the wire 12 and then moves laterally to the position of a lead 4 (second bonding point).

(4) In step (d), after moving to the lead 4 (second bonding point), the capillary 16 is made to descend, and bonding is performed on the lead 4 (second bonding point). By this bonding, the wire 12 is pressure-bonded onto the lead 4 (second bonding point) to form a second bonding point 7.

(5) In step (e), after bonding to the lead 4 (second bonding point), a clamper 17 is opened, the capillary 16 is raised, and the tail wire 8 is led out at the tip end of the capillary 16.

(6) In step (f), after leading out the tail wire 8, the clamper 17 is closed and raised together with the capillary 16, whereby the tail wire 8 is cut away from the lead 4 (second bonding point).

The detail of the tail wire cutting in the wire bonding process as described above is shown in FIGS. 12(a) to 12(c). FIG. 12(a) shows the conditions prior to cutting the tail wire, FIG. 12(b) shows the conditions after the tail wire has been cut normally, and FIG. 12(c) shows a case where the wire 12 has bent and deformation has developed when cutting the tail wire 8.

As seen from FIG. 12(a), prior to tail wire cutting, the lower end of the tail wire 8 that has thinned in a tapered shape is connected to the bonding end 7a that has been mashed so as to become thin in conjunction with the bonding of the connecting wire 12a at the end of the second bonding point 7 to the lead 4 (second bonding point). As shown in FIG. 12(b), when the clamper 17 is closed and the clamper 17 and capillary 16 are raised, the tail wire 8 is pulled upward. When that occurs, the tail wire 8 is cut between the lower end of the tail wire that has become thin and the bonding end 7a.

However, depending on the bonding conditions, there are cases that the shapes of the tail wire end and the bonding end 7a have not become all that thin. In such cases, when the wire 12 is gripped by the clamper 17, and the tail wire 8 is pulled up, the tail wire 8 will not immediately be cut at the bonding end 7a; as a result, a large pulling force acts on the tail wire 8 and, after such a condition is reached that the tail wire 8 has been pulled and stretched, the tail wire 8 will be cut at the bonding end 7a. In this case, as shown in FIG. 12(c), the tail wire 8 that has been pulled and stretched snaps upward with a recoil force when cut, so that the wire 12 below the clamper 17, and the tail wire will bend in an S shape. Tail wire 8 bending is a problem, causing ball shape defects due to electrical discharges or the like during bonding to the next pad 3. Also, even if the ball is well formed, bent segments remain in the wire 12 inside the capillary 16 and between the capillary 16 and the clamper 17. Therefore, when bonding is performed with that wire 12 between the pad 3 (first bonding point) and lead 4 (second bonding point), the connecting wire 12a between the pad 3 (first bonding point) and lead 4 (second bonding point) will bend in an S shape as shown in FIG. 13. When the connecting wire 12a is not in a straight line shape and deforms in an S shape as shown in FIG. 13, problems occur that the connecting wires 12a come into contact with each other.

In view of the problems described above, various methods have been proposed for wire cutting so that bending deformations do not remain in the tail wire. Japanese Patent No. 2723277, for example, discloses that prior to gripping the wire 12 by the clamper 17 and pulling the tail wire 8 up, the positions of the capillary 16 and the clamper 17 are moved laterally so that the centerline of the up and down motion of the capillary 16 and clamper 17 coincide with the bonding end 7a, and then the wire 12 is gripped, and the wire 12 is pulled up and cut. In Japanese Patent No. 2969953, after opening the clamper 17 and leading the tail wire 8 out, the tail wire 8 is made to resonate by causing the capillary 16 to vibrate at the characteristic frequency of the tail wire 8, thus cutting the tail wire 8 by that vibration.

However, in the conventional art disclosed in Japanese Patent No. 2723277, even if it is possible to prevent the tail wire 8 led out of the tip end of the capillary 16 from bending, when the bonding end 7a is not sufficiently thin, a large pulling force will act on the wire 12 when the tail wire 8 is cut. As a result, the wire 12 would be snapped upward by recoil forces when cutting the tail wire 8, so that the wire 12 below the clamper 17 and the tail wire bend into an S shape.

In the conventional art disclosed in Japanese Patent No. 2969953, when the frequency that can be applied to the capillary 16 is around 30 kHz, in order for the tail wire 8 to resonate, the length thereof must be made from 1.3 to 3.4 mm. Thus, the problem is that this art cannot be used for short tail wire lengths required in today's high-speed bonding apparatuses.

BRIEF SUMMARY OF THE INVENTION

Accordingly, the object of the present invention is to provide a tail wire cutting method and bonding apparatus that effects tail wire cutting without subjecting the tail wire to large pulling forces and that prevents wire bending when cutting of the tail wire is performed.

The above object is accomplished by a set of unique steps of the present invention for a tail wire cutting method for a bonding apparatus cutting a tail wire paid out at a tip end of a capillary, after bonding a wire from a first bonding point to a second bonding point, and in the present invention, the tail cutting method comprises the steps of:

opening a clamper of the bonding apparatus and raising the capillary together with the clamper from the second bonding point to a first height to pay out the tail wire at the tip end of the capillary; then closing the clamper and causing the capillary together with the clamper to make one of arc-shaped reciprocating oscillation movement and circular oscillation movement on a curved surface having an apex thereof at the first height, thus degrading a rigidity of a connecting portion between the tail wire and the second bonding point; then opening the clamper and raising the capillary together with the clamper from the first height to a second height to pay out further the tail wire at the tip end of the capillary; and then closing the clamper and raising further the capillary together with the clamper from the second height to cut the tail wire from the second bonding point.

The above object is accomplished by another set of unique steps of the present invention for a tail wire cutting method for a bonding apparatus cutting a tail wire paid out at a tip end of a capillary, after bonding a wire from a first bonding point to a second bonding point, and in the present invention, the tail wire cutting method comprises the steps of:

opening a clamper of the bonding apparatus and raising the capillary together with the clamper from the second bonding point to a first height to pay out the tail wire at the tip end of the capillary; then closing the clamper and causing the capillary together with the clamper to make one of reciprocating oscillation movement and circular oscillation movement on a flat surface that is at the first height and parallel with a work, thus degrading a rigidity of a connecting portion between the tail wire and the second bonding point; then opening the clamper and raising the capillary together with the clamper from the first height to a second height to pay out further the tail wire at the tip end of the capillary; and then closing the clamper and raising further the capillary together with the clamper from the second height to cut the tail wire from the second bonding point.

In the above-described tail wire cutting methods of the present invention, it is preferable that the reciprocating oscillation movement be made along a line connecting the first bonding point and the second bonding point.

Furthermore, the above object is accomplished by a unique structure of the present invention for a bonding apparatus for bonding with a wire from a first bonding point to a second bonding point, and in the present invention, the bonding apparatus comprises:

a movement mechanism for moving in XYZ directions a capillary having the wire passing therethrough and bonding to a work and a clamper for holding the wire;

a clamper opening and closing device for opening and closing the clamper;

means for detecting a height of the capillary; and a computer for controlling cutting a tail wire paid out at a tip end of the capillary after bonding the first bonding point and the second bonding point with the wire; and the computer includes a first capillary raising means for opening the clamper by the clamper opening and closing device and raising the capillary together with the clamper by the movement mechanism until a signal indicating that the capillary has ascended to a first height is output by the capillary height detection means, thus paying out the tail wire at the tip end of the capillary, after performing bonding to the second bonding point, a movement on a curved surface means for closing the clamper by the clamper opening and closing device and causing the capillary together with the clamper, by the movement mechanism, to make one of arc-shaped reciprocating oscillation movement and circular oscillation movement on a curved surface having an apex thereof at the first height, thus degrading a rigidity of a connecting portion between the tail wire and the second bonding point, after raising the capillary to the first height by the first capillary raising means, a second capillary raising means for opening the clamper by the clamper opening and closing device and raising the capillary together with the clamper by the movement mechanism, until a signal indicating that the capillary has ascended to a second height is output by the capillary height detection means, thus paying out further the tail wire at the tip end of the capillary, after the movement on the curved surface by the movement on a curved surface means, and a wire cutting means for closing the clamper by the clamper opening and closing device and raising further the capillary together with the clamper by the movement mechanism, thus cutting the tail wire from the second bonding point, after raising the capillary to the second height by the second capillary raising means.

In addition, the above object is accomplished by another unique structure of the present invention for a bonding apparatus for bonding with a wire from a first bonding point to a second bonding point, and in the present invention, the bonding apparatus comprises:

a movement mechanism for moving in XYZ directions a capillary having the wire passing therethrough and bonding to a work and a clamper for holding the wire;

a clamper opening and closing device for opening and closing the clamper;

means for detecting a height of the capillary; and a computer for controlling cutting a tail wire paid out at a tip end of the capillary after bonding the first bonding point and the second bonding point with the wire; and the computer includes a first capillary raising means for opening the clamper by the clamper opening and closing device and raising the capillary together with the clamper by the movement mechanism until a signal indicating that the capillary has ascended to a first height is output by the capillary height detection means, thus paying out the tail wire at the tip end of the capillary, after performing bonding to the second bonding point, a movement on a flat surface means for closing the clamper by the clamper opening and closing device and causing the capillary together with the clamper by the movement mechanism, to make one of reciprocating oscillation movement and circular oscillation movement on a flat surface being at the first height and parallel with a work, thus degrading a rigidity of a connecting portion between the tail wire and the second bonding point, after raising the capillary to the first height by the first capillary raising means, a second capillary raising means for opening the clamper by the clamper opening and closing device and raising the capillary together with the clamper by the movement mechanism, until a signal indicating that the capillary has ascended to a second height is output by the capillary height detection means, thus paying out further the tail wire at the tip end of the capillary, after the movement on the flat surface by the movement on a flat surface means, and a wire cutting means for closing the clamper by the clamper opening and closing device and raising further the capillary together with the clamper by the movement mechanism, thus cutting the tail wire from the second bonding point, after raising the capillary to the second height by the second capillary raising means.

In the above-described bonding apparatus, the reciprocating it is preferable that the oscillation movement be made along a line connecting the first bonding point and the second bonding point.

The present invention provides the benefits that a tail wire is cut without subjecting it to any large pulling force, and wire bending that would occur when cutting tail wires is prevented.

DETAILED DESCRIPTION OF THE INVENTION

Figure 1:
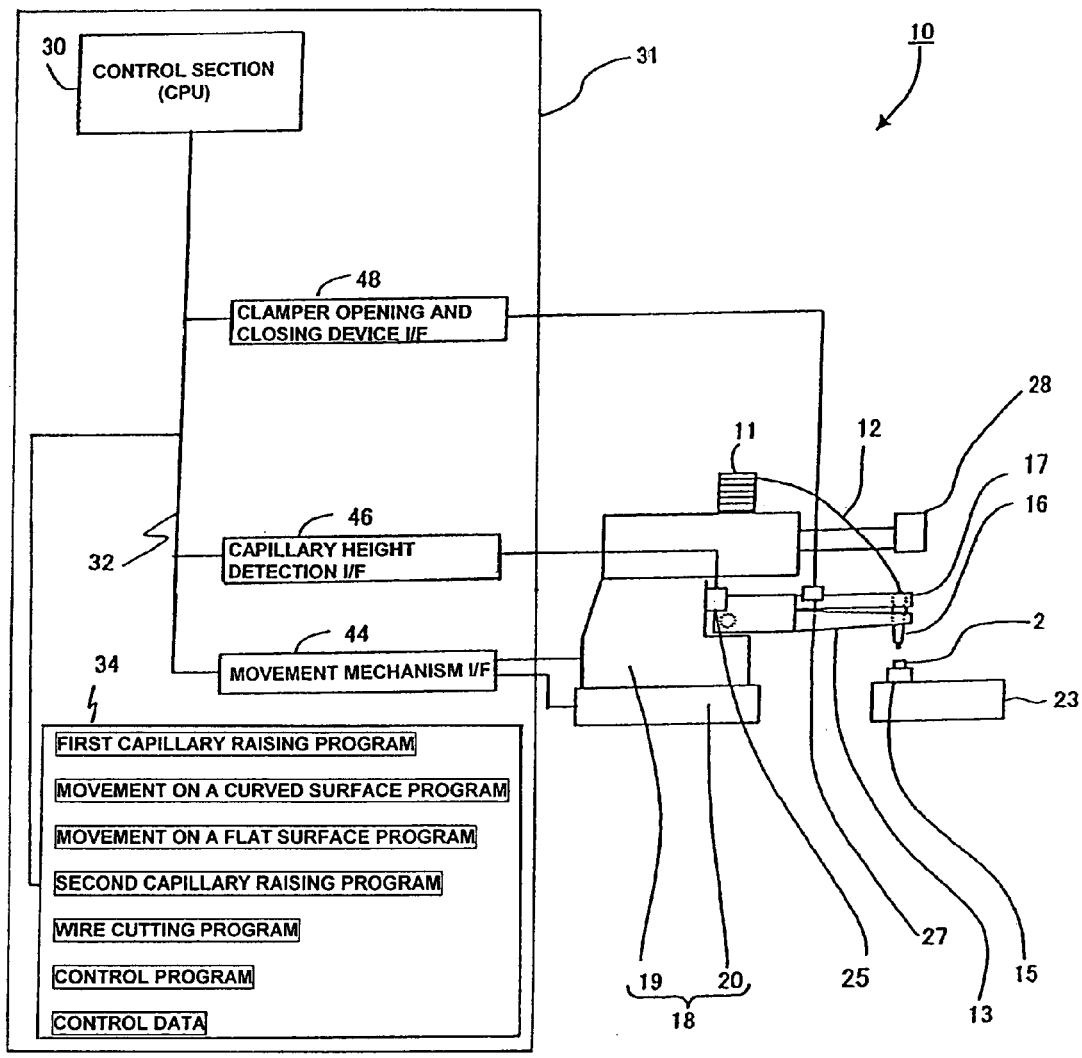
FIG. 1 illustrates the configuration of a wire bonding apparatus in which the tail wire cutting method and program of the present invention is executed.
Figure 2:
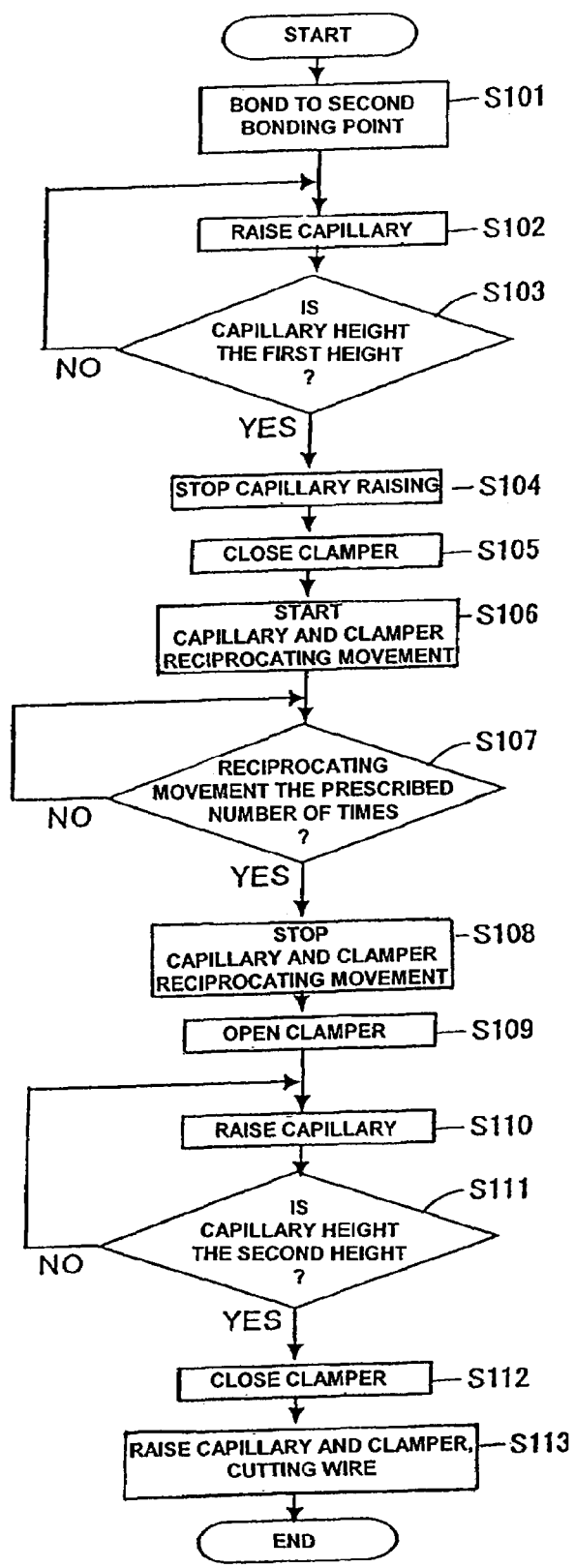
FIG. 2 is a flowchart of an embodiment of the tail wire cutting method and program of the present invention.
Figure 3:
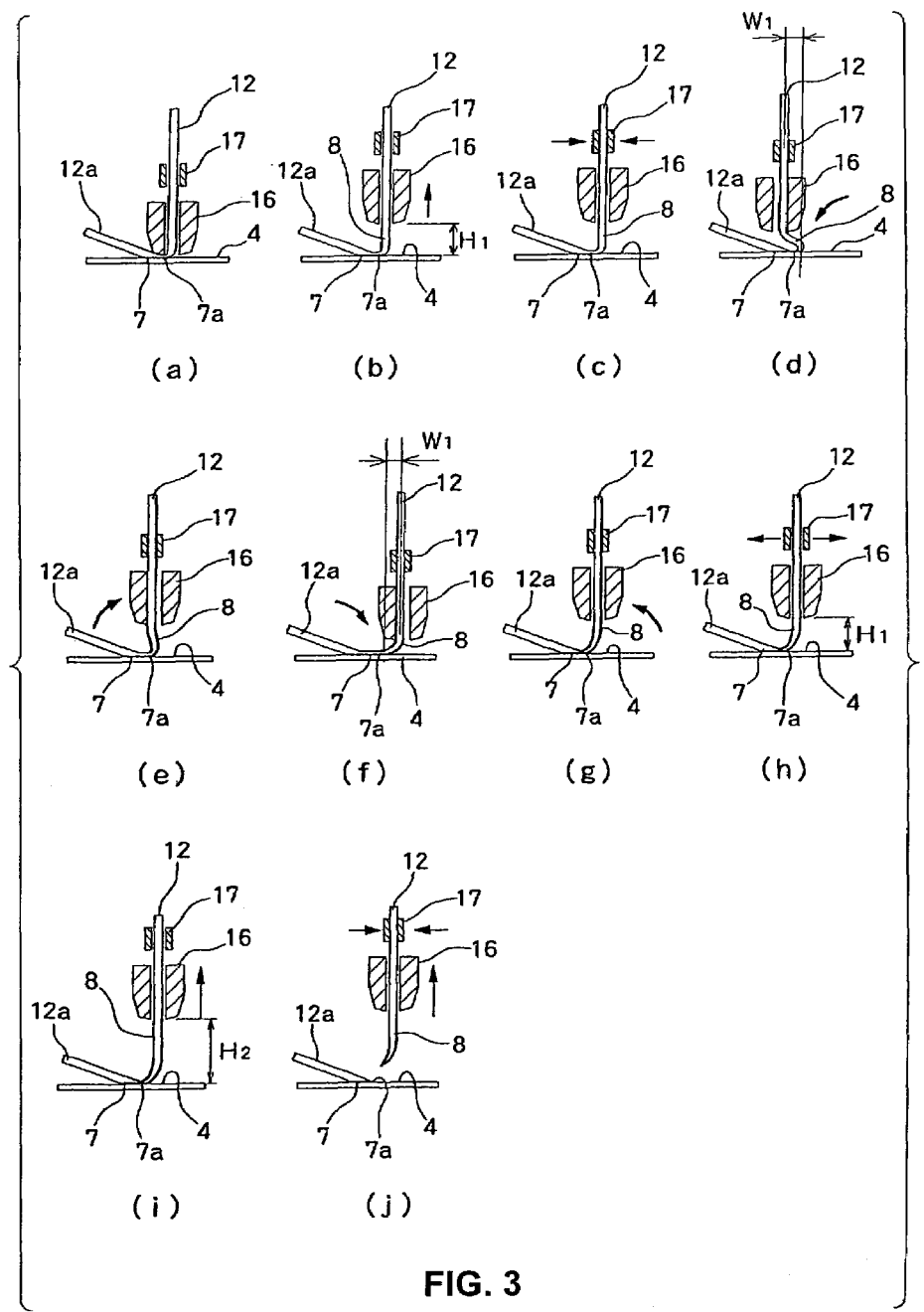
FIG. 3 shows the process for cutting a tail wire when the tail wire cutting method and program according to the present invention is executed.
Figure 4:
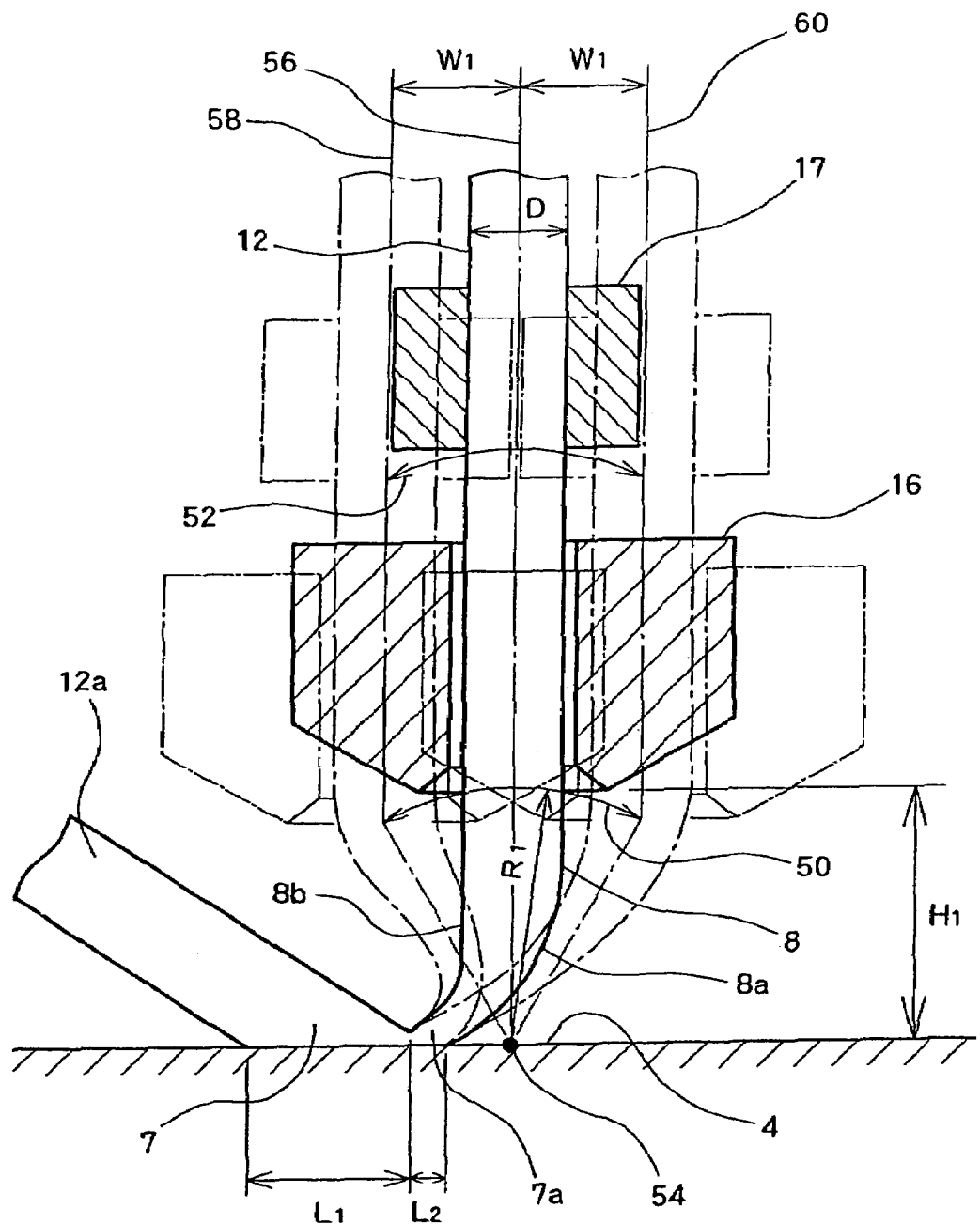
FIG. 4 is an explanatory diagram of the reciprocating oscillation movement of the capillary and clamper according to the present invention in the wire bonding apparatus.
Figure 5:
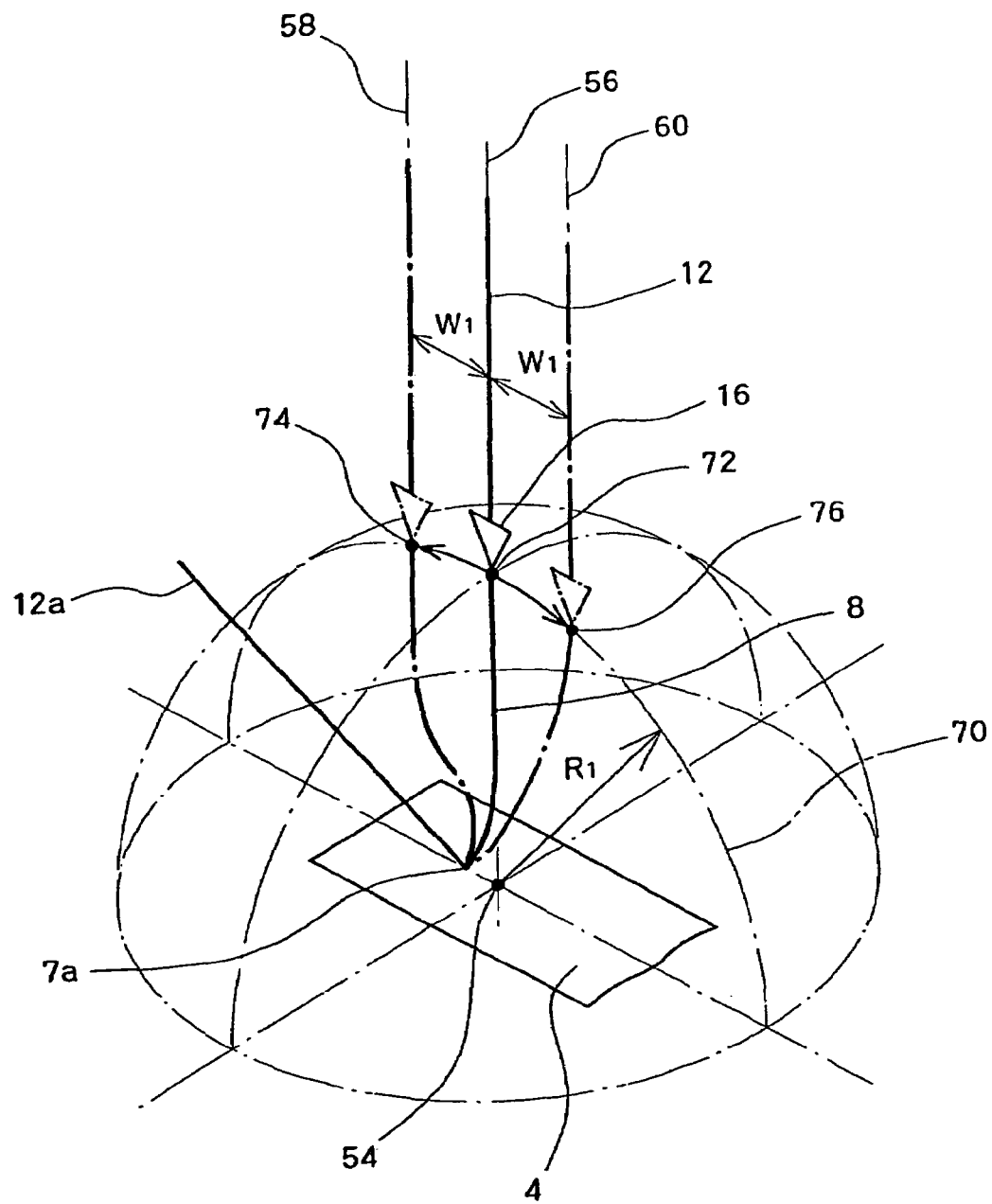
FIG. 5 is a perspective view of the reciprocating oscillation movement, on a curved surface, of the capillary and clamper according to the present invention in the wire bonding apparatus.

Hereinafter, preferred embodiments of the present invention will be described with reference to FIGS. 1 to 5. FIG. 1 is a diagram representing the configuration of a wire bonding apparatus that executes a tail wire cutting method and program of to the present invention. FIG. 2 is a flowchart of a tail wire cutting method of the present invention. FIG. 3 is an explanatory diagram of the steps for cutting a tail wire according to the method and program of the present invention. FIG. 4 is an explanatory diagram of the reciprocating oscillation movement of a capillary and clamper in the present invention. FIG. 5 is a perspective view of the reciprocating oscillation movement, on a curved surface, of a capillary and clamper in the present invention.

As seen from FIG. 1, in a wire bonding apparatus 10, a bonding head 19 is installed on an XY table 20, and a bonding arm 13, the tip whereof being movable in the Z direction by a motor, is provided on the bonding head 19. A capillary 16 is attached to the tip end portion of the bonding arm 13. The XY table 20 and the bonding head 19 configure a movement mechanism 18. The movement mechanism 18 can, by the XY table 20, move the bonding head 19 to any position within a horizontal plane (within the XY plane) and, by moving the bonding arm 13 attached thereto in the Z direction, can move the capillary 16 at the tip end portion of the bonding arm 13 freely in XYZ directions.

The bonding arm 13 is equipped with a capillary height detection device 25 for detecting the height of the capillary 16. The capillary height detection device 25 can be a means that detects the height of the tip end of the capillary 16 (or the distance between the lower end of the capillary 16 and the top surface of a work) by detecting the turning angle of the bonding arm 13 with an angle sensor or can be a position sensor that directly detects the height of the tip end of the capillary 16.

A wire 12 passes through the tip end portion of the bonding arm 13. The wire 12 is wound on a spool 1.

To the bonding head 19, a clamper 17 is attached so that it opens and closes freely for gripping the wire 12 and moves together with the capillary 16 in a Z (vertical) direction. The clamper 17 has a clamper opening and closing device 27 for opening and closing the clamper 17. The clamper opening and closing device 27 can be a means that performs opening and closing of the clamper 17 electromagnetically or a means that performs opening and closing of the clamper 17 mechanically.

To the bonding head 19 is attached an image capture device 28 that captures images of a work (14). The image capture device 28 captures the images of the capillary 16, semiconductor chip 2, and lead frame 15 and detects positions of the capillary 16 relative to the semiconductor chip 2 or the lead frame 15.

The movement mechanism 18 is connected to a movement mechanism interface 44, the capillary height detection device 25 is connected to a capillary height detection interface 46, and the clamper opening and closing device 27 is connected to a clamper opening and closing device interface 48. The interfaces are connected through a data bus 32 to a control section 30 for controlling the bonding action, which are respectively component parts of a computer 31. The control section 30 is provided therein with a CPU used for controlling the bonding action. To the data bus 32 is connected a memory unit 34 which stores control data and programs including a first capillary raising program, a movement on a curved surface program, a movement on a flat surface program, a second capillary raising program, a wire cutting program, and a control program.

Referring to FIGS. 2 and 3, the process of cutting a tail wire 8 by the bonding apparatus described above will be described.

As in the conventional art, after bonding to a pad 3 (first bonding point) on the semiconductor chip 2, the wire 12 is led out, and the capillary 16 is moved over the lead 4 (second bonding point), and then bonding is performed on the lead 4 (second bonding point) in step S101 in FIG. 2. At that time, as shown in (a) of FIG. 3, a connecting wire 12a is pressure-bonded to the lead 4 (second bonding point) by the downward movement of the capillary 16, and a second bonding point 7 is formed; and, at the end of the second bonding point 7, the connecting wire 12a is bonded to the lead 4 (second bonding point), and a bonding end 7a having a thinly mashed shape is formed.

When the bonding for the lead 4 (second bonding point) is finished, then, in step S102 in FIG. 2, the bonding control section 30 causes the tip end portion of the bonding arm 13 to ascend in the Z direction via the movement mechanism 18, raising the capillary 16 attached to the tip end portion of the bonding arm 13. At that time, the bonding control section 30 holds the clamper 17 in an open state by the clamper opening and closing device 27. Meanwhile, the height of the capillary (or the height of the tip end of the capillary) is detected by the capillary height detection device 25, and a height signal thereof is input through the capillary height detection interface 46 to the bonding control section 30.

In step S103 in FIG. 2, the bonding control section 30 continues the raising of the capillary 16 and clamper 17 by the movement mechanism 18 until the signal from the capillary height detection device 25 indicates a capillary height $H_1$ (see (b) of FIG. 3). When the signal from the capillary height detection device 25 indicates the capillary height $H_1$, then, in step S1104 in FIG. 2, the raising of the capillary 16 and clamper 17 by the movement mechanism 18 is stopped. At that time, as shown in (b) of FIG. 3, the tip end of the capillary 16 reaches the height $H_1$, and the tail wire 8 is led out of the tip end of the capillary 16.

Next, in step S105 in FIG. 2 and shown in (c) of FIG. 3, the bonding control section 30 closes the clamper 17 by the clamper opening and closing device 27 and causes the clamper 17 to grip the wire 12. After the wire 12 is gripped by the clamper 17, the bonding control section 30 starts, in step S106 in FIG. 2, the reciprocating oscillation movement of the capillary 16 and clamper 17 by the movement mechanism 18. After the reciprocating oscillation movement has been repeated a prescribed number of times, in steps S107 and S108 in FIG. 2, the reciprocating oscillation movement of the capillary 16 and clamper 17 is stopped by the movement mechanism 18.

The movements of the capillary 16, clamper 17, and tail wire 8 during this reciprocating oscillation movement are shown in (d) to (g) of FIG. 3. As shown in (d), the bonding control section 30 first moves the capillary 16 and the clamper 17, by the movement mechanism 18, in the direction toward the connecting wire 12a, along a circular arc, as shown by a downwardly curved arrow, on a curved surface that is such that the apex thereof is at the height $H_1$ of the tip end of the capillary 16 This curved movement is a movement on a circular arc; accordingly, the bonding control section 30 moves the capillary 16 and clamper 17, by the movement mechanism 18, laterally, in the direction toward the connecting wire 12a, through an oscillation width (or amplitude) $W_1$, and also in an up and down direction, oriented in the direction toward the lead 4 (second bonding point). Then, after the capillary 16 and clamper 17 have been moved laterally for the oscillation width $W_1$, the bonding control section 30, as shown in (e) of FIG. 3, moves the capillary 16 and clamper 17, by the movement mechanism 18, in the opposite direction from the connecting wire 12a, along the same circular arc described above, as shown by an upwardly curved arrow, returning them to their initial positions. After that, as shown in (f) of FIG. 3, the bonding control section 30 moves the capillary 16 and the clamper 17, by the movement mechanism 18, laterally, in the opposite direction from the connecting wire 12a, for the oscillation width $W_1$, and, at the same time, moves them in the up and down direction, oriented in the direction toward the lead 4 (second bonding point) as shown by a downwardly curved arrow. Then, after moving the capillary 16 and clamper 17 laterally for the oscillation width $W_1$, as shown in (g) of FIG. 3, the bonding control section 30 moves the capillary 16 and clamper 17 again in the direction toward the connecting wire 12a, along the same circular arc as described above as shown by an upwardly curved arrow, returning them to their initial positions, and ending one reciprocating oscillation cycle.

The bonding control section 30 causes the capillary 16 and clamper 17 to reciprocally move a prescribed number of times as described above. By that reciprocating oscillation movement, (minute) cracks develop between the lower end of the tail wire 8 and the bonding end 7a, and the rigidity of that portion declines.

When the prescribed number of reciprocating oscillation movements has ended, the bonding control section 30 renders, in step S109 in FIG. 2 and in (h) of FIG. 3, the clamper 17 in an open state by the clamper opening and closing device 27 and releases the wire 12. Then, the bonding control section 30 causes the capillary 16 and clamper 17 to ascend by the movement mechanism 18. The height of the capillary is detected by the capillary height detection device 25, and the height signal thereof is input to the bonding control section 30.

In step S111 in FIG. 2, the bonding control section 30 continues the raising of the capillary 16 and clamper 17 by the movement mechanism 18 until the signal from the capillary height detection device 25 indicates a predetermined capillary height $H_2$ (see (i) in FIG. 3). Then, when the signal from the capillary height detection device 25 indicates the capillary height $H_2$, the bonding control section 30, in step S112 in FIG. 2, closes the clamper 17 by the clamper opening and closing device 27, so that the clamper 17 grips the wire 12. At this point, as shown in (i) of FIG. 3, the tail wire 8, at the height $H_2$, is led out of the tip end of the capillary 16.

In step S113 in FIG. 2, the bonding control section 30 causes the capillary 16 and clamper 17 to ascend further, by the movement mechanism 18, with the wire 12 still gripped by the clamper 17. As a result, as shown in (j) of FIG. 3, the tail wire 8 is cut away from the lead 4 (second bonding point) between the bonding end 7a and the lower end of the tail wire 8 wherein (minute) cracks have developed due to the earlier reciprocating oscillation movement. A more detailed description of the reciprocating oscillation movement described above will be given with reference to FIGS. 4 and 5.

The solid lines in FIG. 4 represent the state that the tip end of the capillary 16 has ascended to the height $H_1$ and the clamper 17 is gripping the wire 12 that has a diameter D. The wire 12 is a gold wire that is 20 μm or so in diameter, and the height $H_1$ is 25 μm to 100 μm. The tail wire 8 is led out of the tip end of the capillary 16. Because the height $H_1$ of the tip end of the capillary is 25 μm to 100 μm, the length of the tail wire 8 is also 25 μm to 100 μm. The lower end of the tail wire 8 is thinner in a tapered shape toward the bottom and is connected to the bonding end 7a. Also, the bonding end 7a is connected to the second bonding point 7 where the connecting wire 12a is pressure-bonded to the lead 4 (second bonding point). The second bonding point 7 is joined to the lead 4 (second bonding point) within the range of a length $L_1$, and the bonding end 7a is joined to the lead 4 (second bonding point) within the range of a length $L_2$ and formed so as to be thin.

The dashed-dotted lines in FIG. 4 represent the condition when the wire 12 has been moved by the capillary 16 and clamper 17 left and right through the oscillation width $W_1$ of 20 to 25 μm. The lower end of the capillary 16 makes a right-and-left reciprocating oscillation movement along a circular arc 50 having a radius $R_1$ centered on the intersection 54 between the centerline 56 of the wire 12 and the lead 4 (second bonding point), the apex thereof is at the height $H_1$. The clamper 17 makes a left-and-right reciprocating oscillation movement, together with the capillary 16, along a circular arc 52 which is parallel to the circular arc 50. Due to the reciprocating oscillation movement, the centerline 56 of the wire 12 makes a reciprocating oscillation movement to the positions of the centerlines 58 and 60, separated for the oscillation width $W_1$, on the side toward the connecting wire 12a and on the opposite side therefrom, respectively.

FIG. 5 is a perspective view graphically representing the reciprocating oscillation movement described above. The capillary 16 is graphically represented by a triangle, and the clamper 17 is omitted. In FIG. 5, a spherical surface 70, having a radius $R_1$, over which the capillary 16 is moved reciprocally, is indicated by dashed-dotted lines. The tip end of the capillary 16 moves in an arc oriented in the direction toward the connecting wire 12a over the spherical surface 70, from a movement starting point 72 toward a point 74, and then, next, moves in the opposite direction from the point 74 through the point 72 to the point 76. Then, from the point 76, the tip end of the capillary 16 again moves in the direction toward the connecting wire 12a to the movement starting point 72, and thus one round trip of the reciprocating oscillation movement is complete. Such a reciprocating oscillation movement is repeated a prescribed number of times, and the reciprocating oscillation movement is then ended when the tip end of the capillary 16 reaches the movement starting point 72.

In the reciprocating oscillation movement described above, the wire 12 is gripped by the clamper and moved together with the capillary 16. Accordingly, the wire 12 will not escape even if a large displacement is produced therein; and thus, it is possible to produce, in the tail wire 8 with the lower end whereof being fixed, a bending deformation in the lateral direction at a height that is 1 to 5 or so times the diameter of the wire 12 and of a size that is about the same as the diameter of the wire 12. The stress generated by such large deformation then produces concentrated stress and plastic deformation in the portion of the tail wire 8 between the bonding end 7a and the tapered part formed at the lower end of the tail wire 8. Then, due to the reciprocating oscillation movement described above, (minute) cracks are produced by the plastic deformation between the bonding end 7a and the lower end of the tail wire 8. Due to the production of these (minute) cracks, the tensile strength of the tail wire 8 between the bonding end 7a and the lower end of the tail wire declines greatly, so that it becomes possible to cut the tail wire 8 at the time of the tail wire 8 cutting action without subjecting the tail wire 8 to a large pulling force. Also, even if such (minute) cracks as described above do not occur, so long as a decline in material rigidity due to plastic deformation does occur between the bonding end 7a and the lower end of the tail wire 8, the tail wire 8 can be cut without subjecting it to a large pulling force. As a result, when cutting the tail wire, no bending deformation will occur in the wire 12, and the occurrence of bending in the connecting wire between the pad 3 (first bonding point) and the lead 4 (second bonding point) can also be prevented, so that the benefit of being able to improve bonding quality is realized.

In the above reciprocating oscillation movement, such a reciprocating oscillation is conducted along a direction (or along a line) connecting the pad 3 (first bonding point) and the lead 4 (second bonding point). Accordingly, during the movement in the lateral direction toward the connecting wire 12a, the portion at the lower end of the tail wire 8 joined slightly to the lead 4 can be peeled away from the lead 4, and the lower end of the tail wire 8 can thus be cut more definitely.

The oscillation width $W_1$ for the reciprocating oscillation movement, the height $H_1$ of the capillary tip, and the radius $R_1$ of the circular arc 50 noted above can be freely determined depending on the thickness and material and the like of the wire 12, so that (minute) cracks develop, due to plastic deformation, between the bonding end 7a and the lower end of the tail wire 8. However, it is necessary that breaks do not occur by the reciprocating oscillation movement, which would happen when, for example, the oscillation width $W_1$ is too large. The reason for that is that, if the tail wire 8 is cut during the reciprocating oscillation movement described above, it will become impossible to lead out the tail wire 8 at the height $H_2$ by the capillary raising movement shown in (i) of FIG. 3 and described in steps S109 to S112 in FIG. 2, and thus it will then no longer be possible to form a ball when performing the next bonding.

Figure 6:
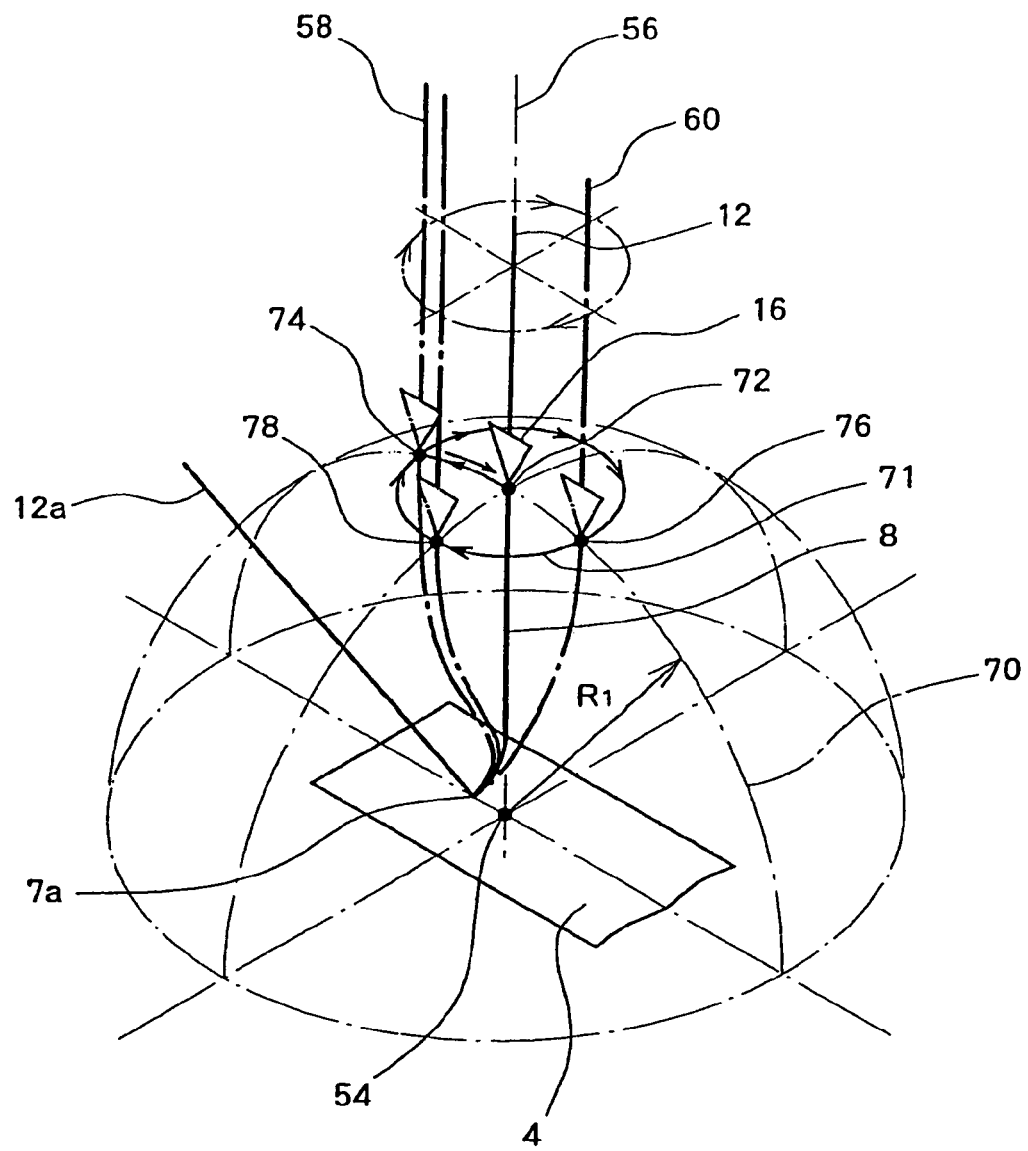
FIG. 6 is a perspective view of the circular oscillation movement, on a curved surface, of the capillary and clamper according to the present invention in the wire bonding apparatus.

In the embodiment described above, the capillary 16 and the clamper 17 are made to make a circular arc-shaped reciprocating oscillation movement. However, it is also possible and appropriate in the present invention to cause the capillary 16 and clamper 17 to make a circular oscillation movement on a curved surface wherein the apex thereof is at the height $H_1$ of the capillary tip. FIG. 6, similar to FIG. 5, is a diagram that represents the circular oscillation movement of the capillary 16 on a spherical surface 70 that has a radius $R_1$, with the clamper 17 omitted.

As seen from FIG. 6, the tip end of the capillary 16 moves in an arc oriented in the direction toward the connecting wire 12a over the spherical surface 70, from a movement starting point 72, which is on the centerline 56 of the wire, toward a point 74. Once it reaches the point 74, the capillary tip moves from the point 74 toward the points 76 and 78, along a circular path 71 on the surface of the spherical surface 70, as indicated by circular arrow. Then, once a prescribed number of circuitous movements have been conducted, the capillary tip moves in an arc over the spherical surface 70 from the point 74 toward the point 72, and, returning to the movement starting point 72, ends its movement on the curved surface. During the movement described above, the clamper 17, while gripping the wire 12, is moved together with the capillary 16. The curved surface for effecting the circular oscillation movement described above is not limited to a spherical surface as in the embodiment described above, and it can be a curved surface such as a parabolic curved surface or a curved surface such as an elliptical curved surface. Moreover, the circuitous movement is not limited to a one-way circuitous movement, and it can be a reciprocating (two-way) movement along a circuitous path.

Figure 7:
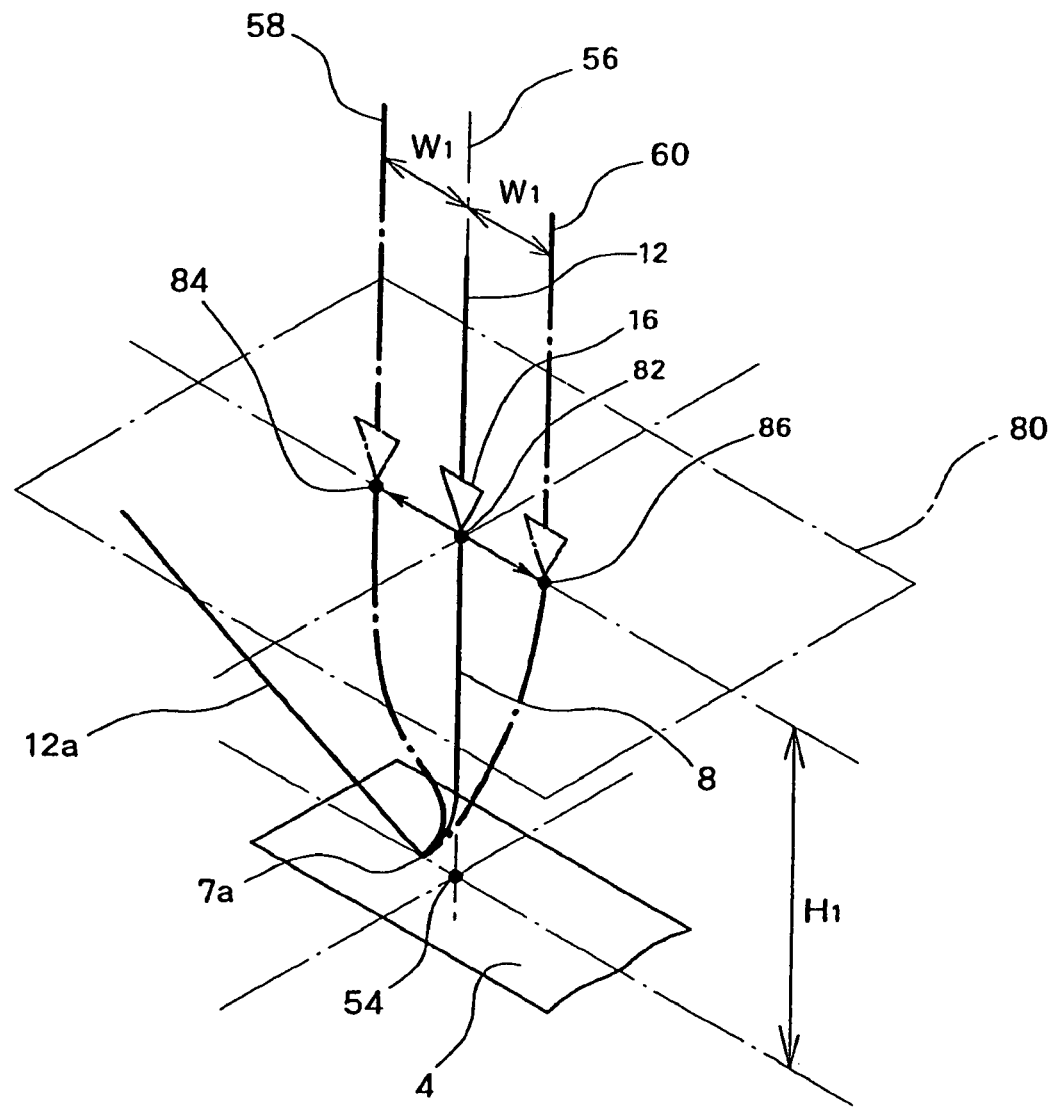
FIG. 7 is a perspective view of the reciprocating oscillation movement, on a flat surface, of the capillary and clamper according to the present invention in the wire bonding apparatus.

In the embodiments described above, the capillary 16 and clamper 17 are moved on a curved surface. However, it is also possible and appropriate in the present invention to move the capillary 16 reciprocally, together with the clamper, over a flat surface that is at the height of the tip end of the capillary 16 and is at height $H_1$, thus forming (minute) cracks due to plastic deformation between the bonding end 7a and the lower end of the tail wire 8. FIG. 7 is a diagram that graphically represents the reciprocating oscillation movement of a capillary 16 on a flat surface 80 parallel to a lead 4 at the height $H_1$ of the tip end of the capillary 16. Like in FIG. 6, the clamper 17 is omitted in FIG. 7.

As shown in FIG. 7, the tip end of the capillary 16 moves from a movement starting point 82 in the direction toward the connecting wire 12a over the flat surface 80 to the point 84. Once it has moved to the point 84, the capillary end moves in the reverse direction through the point 82 to the point 86.

Then, from the point 86, movement is made in the direction toward the connecting wire 12*a* over the flat surface 80 to the point 82, so that one round trip of the reciprocating oscillation movement is complete. Such a reciprocating oscillation movement as this is repeated a prescribed number of times; and, when the tip end of the capillary 16 has reached the movement starting point 82, the reciprocating oscillation movement ends. During the movement described above also, the clamper 17, while gripping the wire 12, is moved together with the capillary 16.

Figure 8:
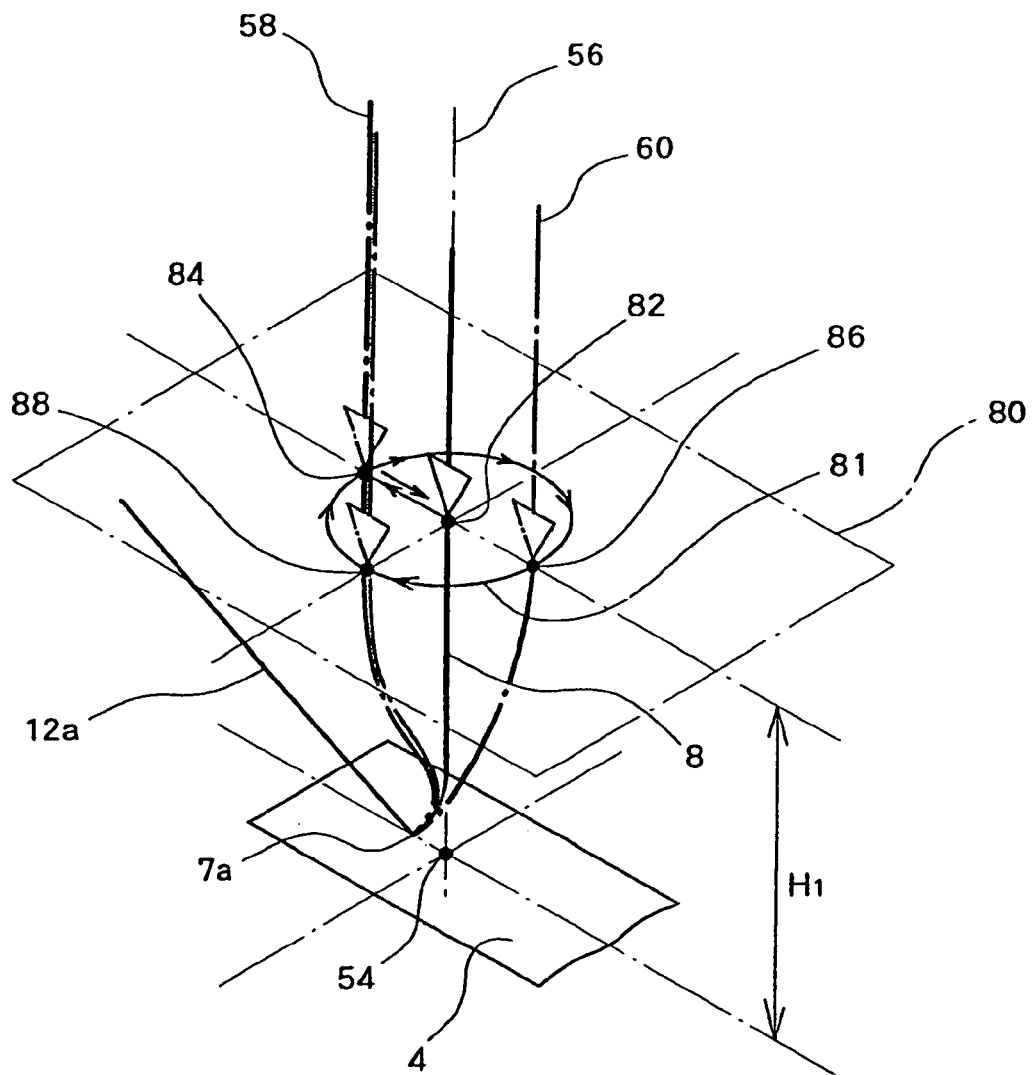
FIG. 8 is a perspective view of the circular oscillation movement, on a flat surface, of the capillary and clamper according to the present invention in the wire bonding apparatus.

FIG. 8, moreover, like FIG. 7, is a diagram that graphically represents the circular oscillation movement of the capillary 16 on a flat surface 80 parallel to a lead 4 at the height $H_1$ of the tip end of the capillary 16. The clamper 17 is omitted in FIG. 8.

As seen from FIG. 8, the tip end of the capillary 16 moves from the movement starting point 82 to the point 84 over the flat surface 80 in the direction toward the connecting wire 12*a*. Once it has reached the point 84, the capillary tip moves from the point 84 to the points 86 and 88, along a circular path 81 that is on the surface of the flat surface 80 as shown by arrows. Then, once a prescribed number of circuitous movements have been conducted, the capillary tip moves over the flat surface 80 from the point 84 toward the point 82, and, returning to the movement starting point 82, ends its movement on the flat surface. During the movement described above also, the clamper 17, while gripping the wire 12, is moved together with the capillary 16. The swing-around circuitous path described above is not limited to a circle, as in the embodiment described above, and it can be an ellipse, oval, or square shape. Also, the circuitous movement is not limited to a circuitous movement oriented in one direction, and it can be a two-way movement along a circuitous path.

When the capillary tip makes a reciprocating oscillation movement or a circular oscillation movement on a flat surface 80 as described above, the side surfaces 8*a* and 8*b* (see FIG. 4) of the tail wire 8 are pulled and stretched by the reciprocating oscillation movement or the circular oscillation movement. In view of that fact, it is preferable that the oscillation width $W_1$ be smaller and the number of reciprocating oscillation movement or the number of circular oscillation movement circuits be larger so that breaks do not occur in the tail wire 8 due to the movement on the flat surface. With such a movement on a flat surface also, as in the embodiments described earlier, when effecting tail wire 8 cutting movements, the tail wire 8 can be cut, without subjecting the tail wire 8 to a large pulling force, and bending in the wire 12 can be prevented.

The foregoing embodiments are described for a wire bonding apparatus. The tail wire cutting method and program of the present invention will be described below in terms of a bump bonding apparatus with reference to FIG. 8. For elements that are the same as those in the embodiments in the wire bonding apparatus, the same symbols are used, and a further explanation thereof will not be provided.

Figure 9:
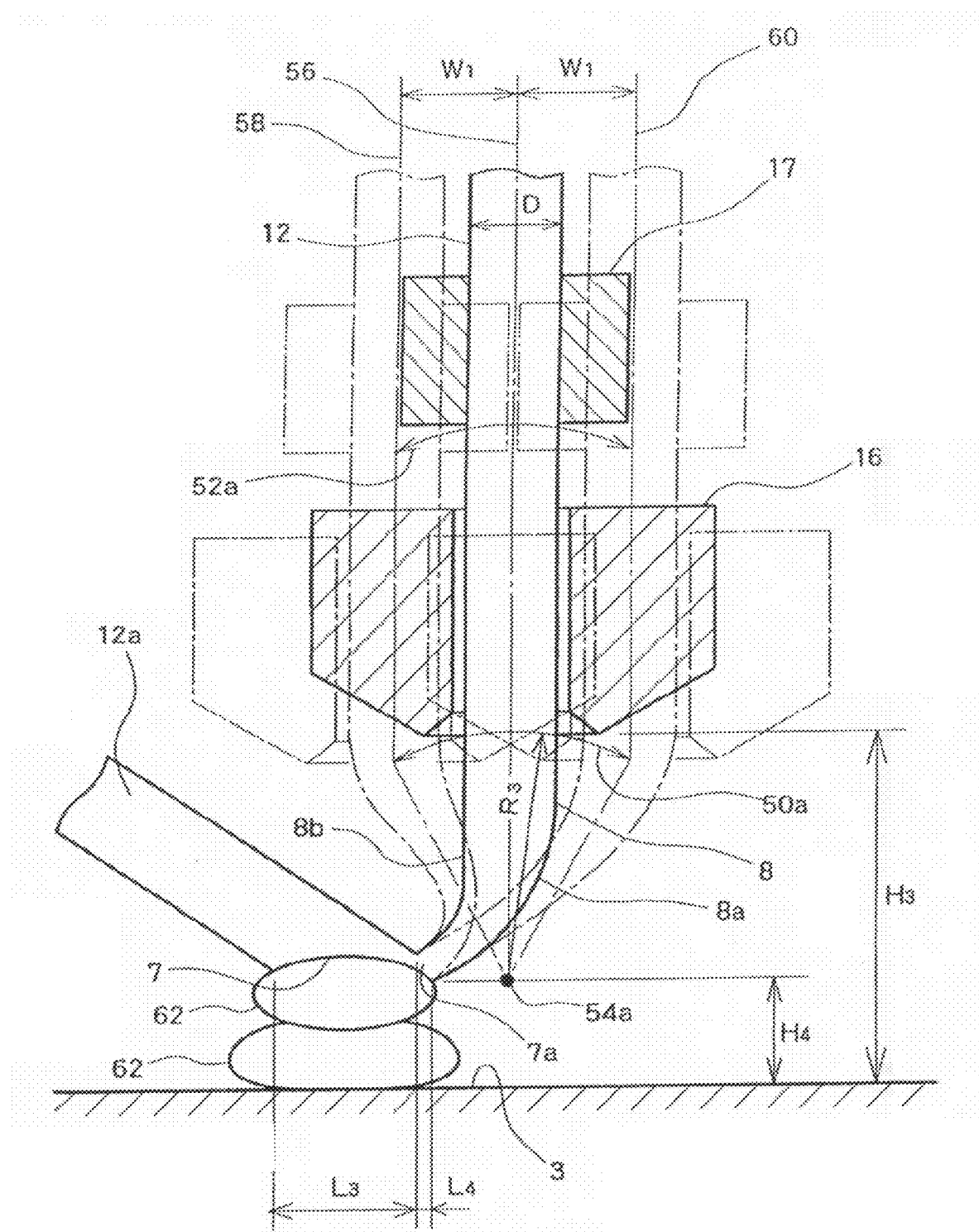
FIG. 9 is an explanatory diagram of the reciprocating oscillation movement of the capillary and clamper according to the present invention in a bump bonding apparatus.
Figure 10:
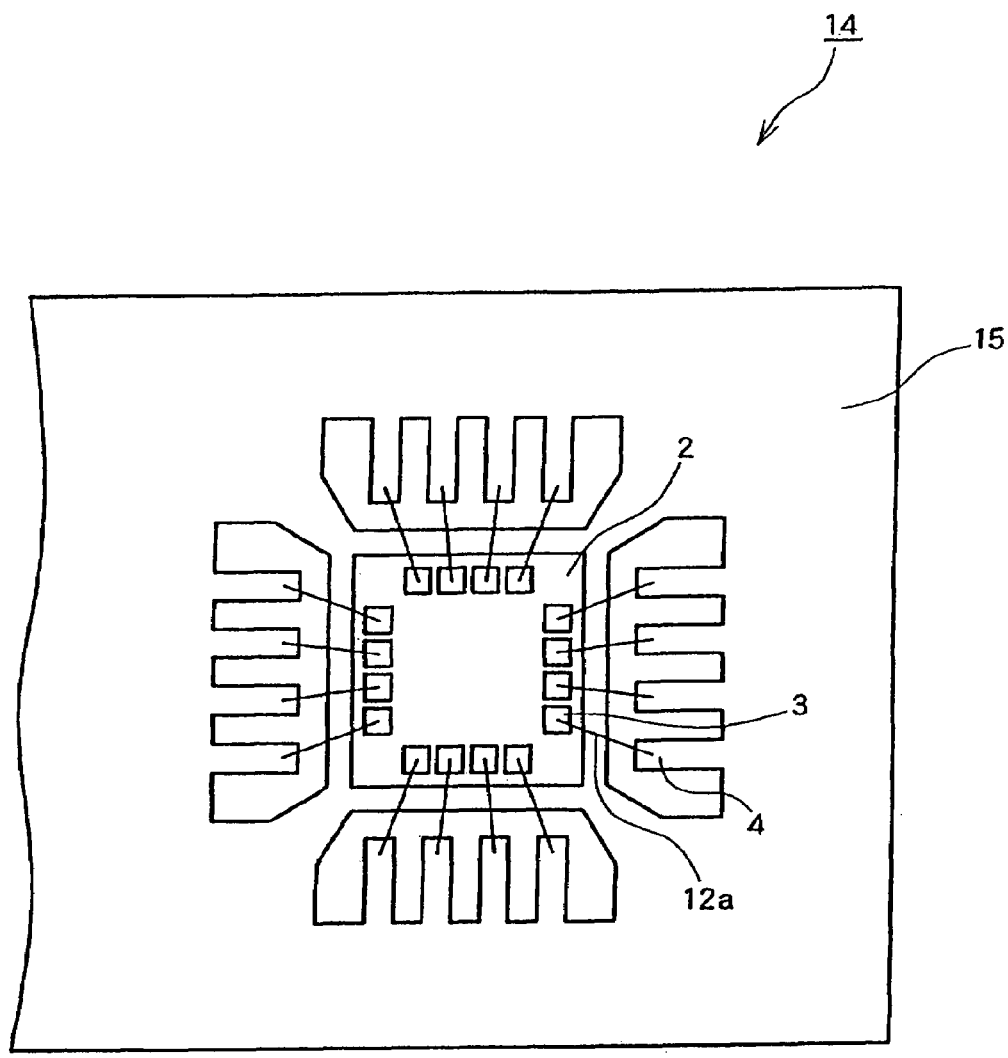
FIG. 10 shows a work wherein a lead frame and a semiconductor chip are connected by wires.
Figure 11:
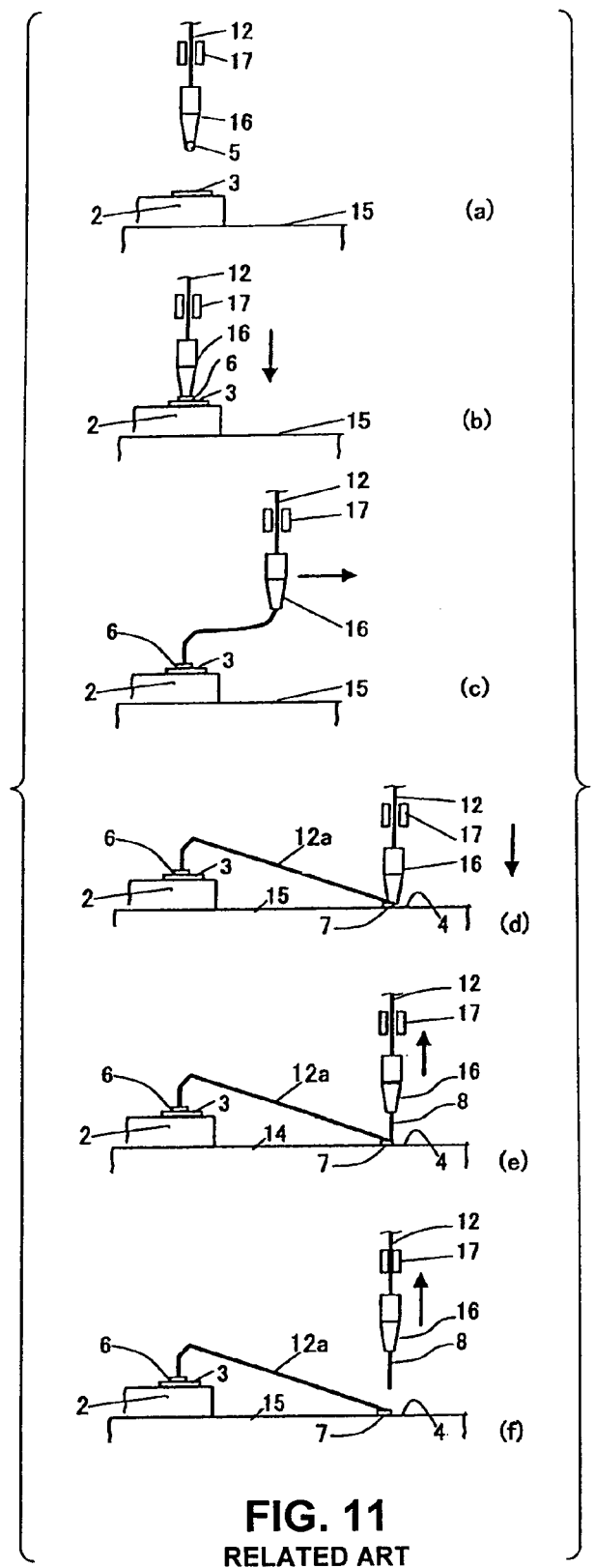
FIG. 11 shows the bonding process in a conventional bonding apparatus.
Figure 12A:
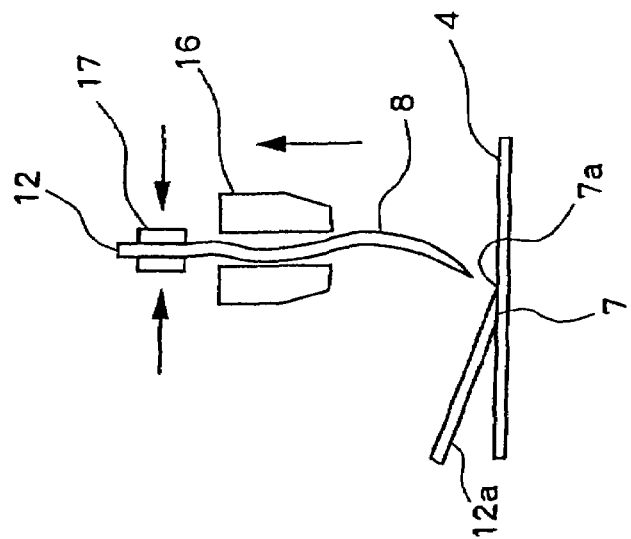
FIGS. 12(a) through 12(c) are explanatory diagrams of the tail wire cutting in a conventional art.
Figure 12B:
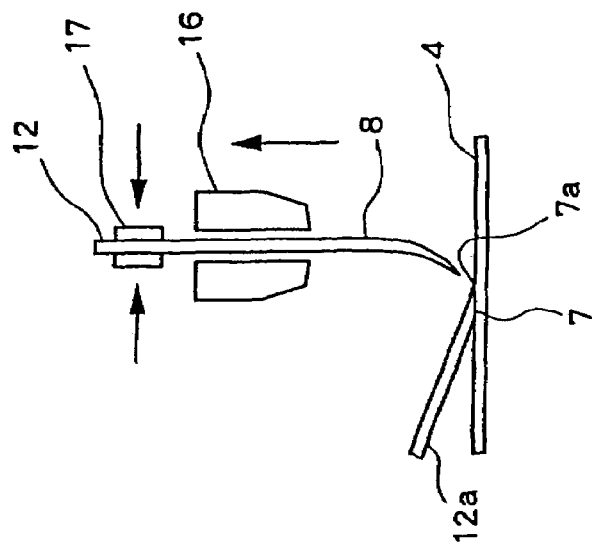
Figure 12C:
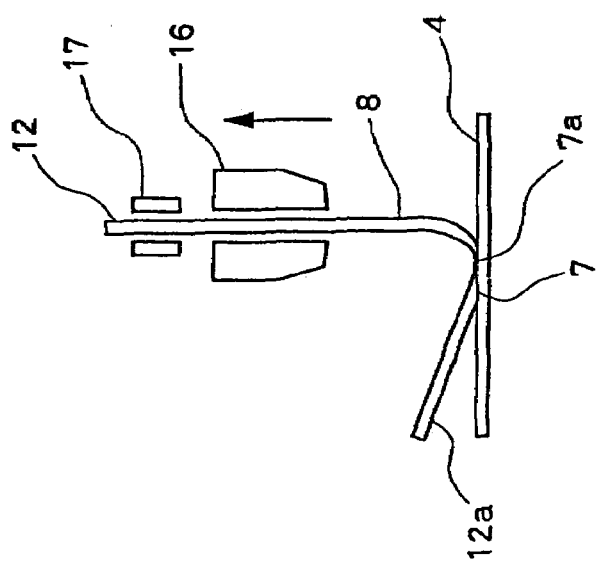
Figure 13:
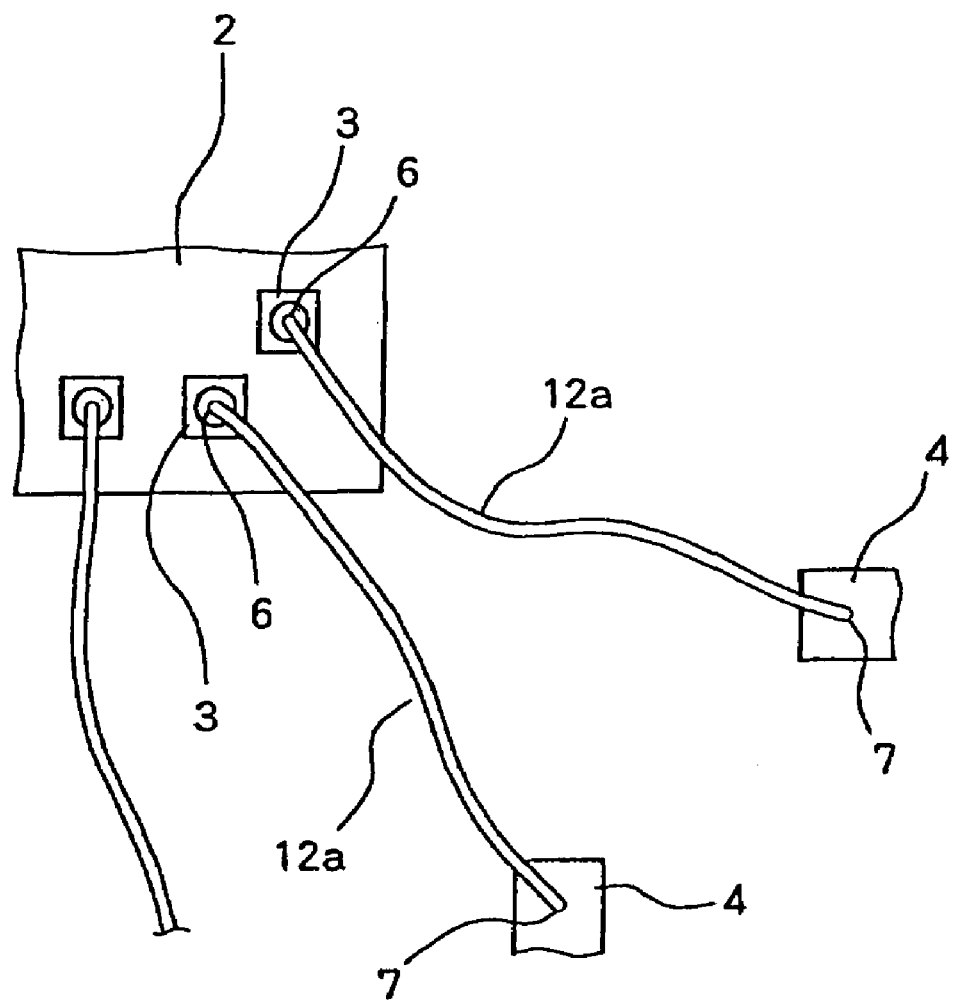
FIG. 13 shows the condition of wires connected between a semiconductor chip and leads in a conventional art.

FIG. 9 shows the reciprocating oscillation movement of a capillary and a clamper when effecting tail wire cutting in a bump bonding apparatus. In the case of a bump bonding apparatus, after forming a ball bump 62 on a pad 3 on a semiconductor chip 2, bonding is performed on a lead 4, then bonding is performed on the pad 3, and the tail wire 8 is cut. Thus, in bump bonding, the first bonding point is the lead 4, and the second bonding point is the pad 3. As shown in FIG. 9, a connecting wire 12*a* is pressure-bonded onto the ball bump 62 formed on the pad 3, and a second bonding point 7 is thus formed.

The dashed-dotted lines in FIG. 9 represent a condition wherein the wire 12 is moved left and right through an oscillation width $W_1$ of 20 to 25 μm by the capillary 16 and the clamper 17. The lower end of the capillary 16 moves reciprocally left and right along a circular arc 50*a* the apex thereof reaches a height $H_3$ with a radius $R_3$ centered on the intersection 54*a* between the centerline 56 of the wire 12 and the upper surface of the ball bump 62 at a height $H_4$ above the pad 3 (second bonding point), while the clamper 17 is moved also reciprocally left and right together with the capillary 16 along a circular arc 52*a* that is parallel with the circular arc 50*a*. By this reciprocating oscillation movement, the centerline 56 of the wire 12 makes a reciprocating oscillation movement to the positions of the centerlines 58 and 60, separated for the oscillation width $W_1$, on the side toward the connecting wire 12*a* and on the opposite side therefrom, respectively. Then, by the reciprocating oscillation movement described above, (minute) cracks develop, due to plastic deformation, between the bonding end 7*a* and the lower end of the tail wire 8, the pulling strength between the bonding end 7*a* and the lower end of the tail wire declines sharply, and thus the tail wire 8 is cut without subjecting the tail wire 8 to a large pulling force.

In the above-described bump bonding apparatus as well, by the reciprocating oscillation movement described in the foregoing, as in a wire bonding apparatus, benefits are realized in that, when effecting cutting movement on the tail wire 8, the tail wire 8 can be cut without subjecting the tail wire 8 to a large pulling force, and bending in the wire 12 is prevented.

The invention claimed is:

1. A tail wire cutting method for a bonding apparatus cutting a tail wire paid out at a tip end of a capillary, after bonding a wire from a first bonding point to a second bonding point comprising the steps of:

opening a clamper of said bonding apparatus and raising said capillary together with said clamper from said second bonding point to a first height to pay out said tail wire at said tip end of said capillary; then closing said clamper and causing said capillary together with said clamper to make one of arc-shaped reciprocating oscillation movement and circular oscillation movement on a curved surface having an apex thereof at said first height, thus degrading a rigidity of a connecting portion between said tail wire and said second bonding point; then opening said clamper and raising said capillary together with said clamper from said first height to a second height to pay out further said tail wire at said tip end of said capillary; and then closing said clamper and raising further said capillary together with said clamper from said second height to cut said tail wire from said second bonding point.

2. A tail wire cutting method for a bonding apparatus cutting a tail wire paid out at a tip end of a capillary, after bonding a wire from a first bonding point to a second bonding point, comprising the steps of:

opening a clamper of said bonding apparatus and raising said capillary together with said clamper from said second bonding point to a first height to pay out said tail wire at said tip end of said capillary; then closing said clamper and causing said capillary together with said clamper to make one of reciprocating oscillation movement and circular oscillation movement on a flat surface that is at said first height and parallel with a work, thus degrading a rigidity of a connecting portion between said tail wire and said second bonding point; then opening said clamper and raising said capillary together with said clamper from said first height to a second height to pay out further said tail wire at said tip end of said capillary; and then closing said clamper and raising further said capillary together with said clamper from said second height to cut said tail wire from said second bonding point.

3. The tail wire cutting method for a bonding apparatus according to claim 1, wherein
said reciprocating oscillation movement is made along a line connecting said first bonding point and said second bonding point.

4. The tail wire cutting method for a bonding apparatus according to claim 2, wherein
said reciprocating oscillation movement is made along a line connecting said first bonding point and said second bonding point.

5. A tail wire cutting method of a bonding apparatus cutting a tail wire paid out at a tip end of a capillary, after bonding a wire from a first bonding point to a second bonding point, the method comprising:
utilizing a bonding apparatus to perform said method, said apparatus comprising:
a wire;
a clamper for holding said wire;
a capillary having said wire passing therethrough and to perform bonding onto a work;
a movement mechanism for moving, in XYZ directions, said capillary and said clamper;
a clamper opening and closing device for opening and closing said clamper;
a capillary height detecting device for detecting a height of said capillary; and
a computer for controlling cutting a tail wire paid out at a tip end of said capillary after bonding said first bonding point and said second bonding point with said wire;
opening said clamper of said bonding apparatus and raising said capillary together with said clamper from said second bonding point to a first height to pay out said tail wire at said tip end of said capillary by means of the bonding apparatus;
closing said clamper and causing said capillary together with said clamper to make coordinated movement by said movement mechanism at said first height, thus degrading a rigidity of a connecting portion between said tail wire and said second bonding point by means of the bonding apparatus;
opening said clamper and raising said capillary together with said clamper from said first height to a second height to pay out further said tail wire at said tip end of said capillary by means of the bonding apparatus; and
closing said clamper and raising further said capillary together with said clamper from said second height to cut said tail wire from said second bonding point by means of the bonding apparatus.

6. The tail wire cutting method according to claim 5, wherein
said coordinated movement by said movement mechanism is arc-shaped reciprocating oscillation movement on a curved surface having an apex thereof.

7. The tail wire cutting method according to claim 5, wherein
said coordinated movement by said movement mechanism is circular oscillation movement on a curved surface having an apex thereof.

8. The tail wire cutting method according to claim 6, wherein
said reciprocating oscillation movement is made along a line connecting said first bonding point and said second bonding point.

9. The tail wire cutting method according claim 5, wherein
said coordinated movement by said movement mechanism is reciprocating oscillation movement on a flat surface that is parallel with a work.

10. The tail wire cutting method according claim 5, wherein
said coordinated movement by said movement mechanism is circular oscillation movement on a flat surface that is parallel with a work.

11. The tail wire cutting method according to claim 9, wherein
said reciprocating oscillation movement is made along a line connecting said first bonding point and said second bonding point.

* * * * *